(12) United States Patent
Nagarajan et al.

(10) Patent No.: US 7,190,082 B2
(45) Date of Patent: Mar. 13, 2007

(54) LOW STRESS FLIP-CHIP PACKAGE FOR LOW-K SILICON TECHNOLOGY

(75) Inventors: Kumar Nagarajan, San Jose, CA (US); Zafer Kutlu, Menlo Park, CA (US)

(73) Assignee: LSI Logic Corporation, Milipitas, CA (US)

( * ) Notice: Subject to any disclaimer, the term of this patent is extended or adjusted under 35 U.S.C. 154(b) by 626 days.

(21) Appl. No.: 10/396,955

(22) Filed: Mar. 24, 2003

(65) Prior Publication Data

US 2004/0188862 A1 Sep. 30, 2004

(51) Int. Cl.
*H01L 23/29* (2006.01)
*H01L 23/48* (2006.01)
*H01L 23/52* (2006.01)
*H01L 29/40* (2006.01)

(52) U.S. Cl. .............. 257/795; 257/787; 257/778; 257/737; 257/E23.121; 257/789

(58) Field of Classification Search ........... 257/789, 257/795, 787, 778, 737, 738
See application file for complete search history.

(56) References Cited

U.S. PATENT DOCUMENTS

| | | |
|---|---|---|
| 6,251,705 B1 | 6/2001 | Degani et al. |
| 6,335,571 B1 | 1/2002 | Capote et al. |
| 6,724,091 B1 * | 4/2004 | Jayaraman et al. .......... 257/778 |
| 2002/0031868 A1 * | 3/2002 | Capote et al. ............. 438/126 |
| 2004/0086719 A1 * | 5/2004 | Chan et al. ................ 428/413 |

* cited by examiner

*Primary Examiner*—Nitin Parekh
(74) *Attorney, Agent, or Firm*—Eric James Whitesell

(57) ABSTRACT

An underfill includes a base material and a filler material added to the base material wherein the filler material constitutes a selected percentage by weight of the underfill to provide an optimum balance between interfacial die stress and solder bump strain for next generation, Cu, low-K silicon technology.

12 Claims, 2 Drawing Sheets

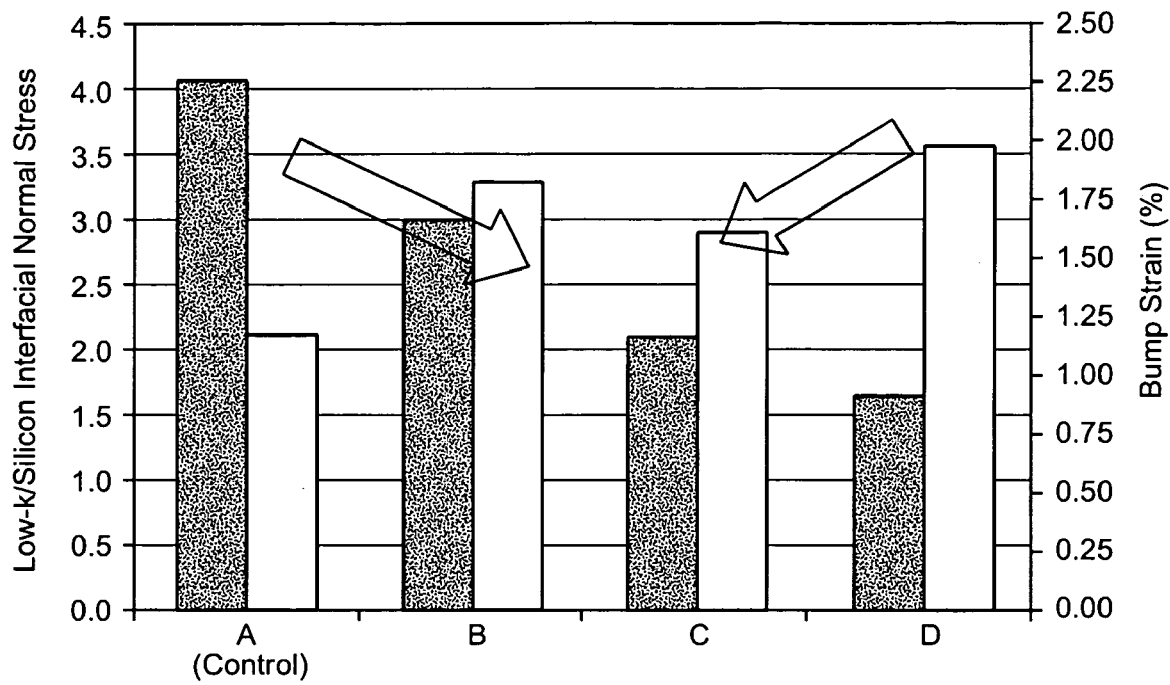
FIG._1
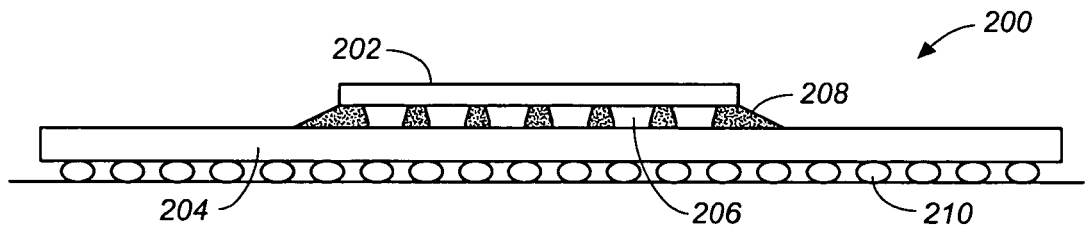
FIG._2
*(PRIOR ART)*
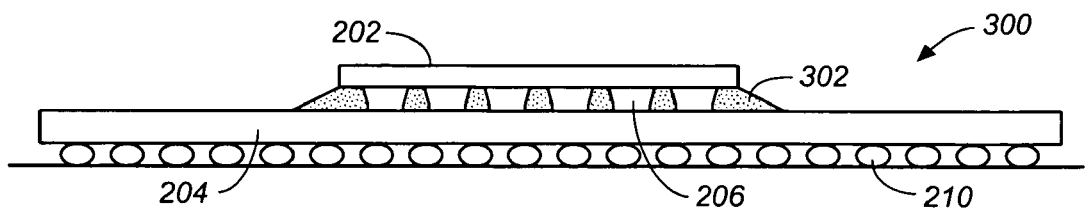
FIG._3

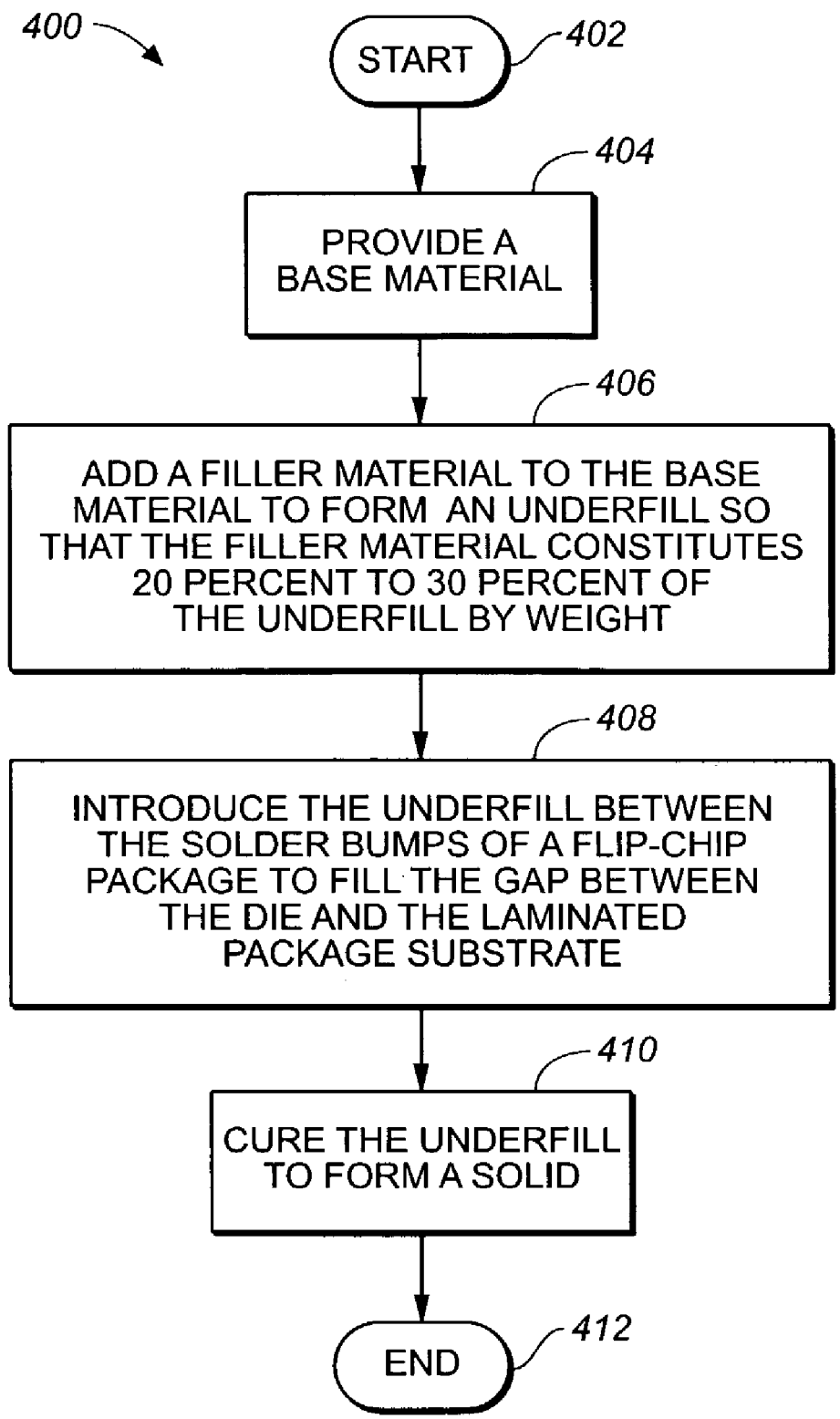
FIG._4

LOW STRESS FLIP-CHIP PACKAGE FOR LOW-K SILICON TECHNOLOGY

BACKGROUND OF THE INVENTION

1. Field of the Invention

The present invention relates generally to package construction of integrated circuits. More specifically, but without limitation thereto, the present invention relates to the electrical and mechanical connection of a semiconductor die to an integrated circuit package, more specifically, a flip-chip ball grid array (FPBGA) package.

2. Description of the Prior Art

One obstacle to flip-chip technology when applied to polymer printed circuit substrates is the poor reliability of solder joints due to mismatch of the coefficients of thermal expansion of the chip, which typically has a coefficient of thermal expansion of about 3 ppm/° C.; the polymer substrate, for example, epoxy-glass, which has a coefficient of thermal expansion of about 16–26 ppm/° C.; and the solder joint, which has a coefficient of thermal expansion of about 25 ppm/° C. The mismatch in the coefficients of thermal expansion results in stress on the solder joints during thermal expansion and contraction that may cause the chip to malfunction.

The trend towards copper metallization and low-k dielectrics for 0.13 micron and smaller silicon technologies is driving the development of new packaging processes and material. In flip-chip packages, the most critical material may be the underfill material. Due to its close proximity to the inner layers of the silicon die, the underfill material influences the stress conditions at the low-K dielectric layers of the silicon. Consequently, the underlying underfill material and the processes associated with its formation play an important role in determining the reliability of the silicon in the flip-chip package.

SUMMARY OF THE INVENTION

In one aspect of the present invention, an underfill for an integrated circuit package includes a base material and a filler material added to the base material wherein the filler material constitutes a percentage by weight of the underfill to provide an optimum balance between interfacial die stress and solder bump strain.

In another aspect of the present invention, a method of reducing interfacial stress in an integrated circuit package includes steps of providing a base material and adding a filler material to the base material wherein the filler material constitutes a percentage by weight of the underfill selected to provide an optimum balance between interfacial die stress and solder bump strain.

In a further aspect of the present invention, an underfill for an integrated circuit package includes a base material and a filler material added to the base material wherein the filler material constitutes about 20 percent to 30 percent of the underfill by weight and wherein the underfill has a glass transition temperature in the range of about 135° C. to about 150° C., a Young's modulus of about 3.0 GPa to 4.0 GPa, and a coefficient of thermal expansion of about 55 to 60 ppm/° C.

BRIEF DESCRIPTION OF THE DRAWINGS

The present invention is illustrated by way of example and not limitation in the accompanying figures, in which like references indicate similar elements throughout the several views of the drawings, and in which:

FIG. 1 illustrates the estimated interfacial die stress at the interface between the underfill and a low-K silicon dielectric and the solder bump strain for four underfill materials in a 45 mm ball grid array package;

FIG. 2 illustrates a partial side view of a typical flip chip ball grid array package of the prior art;

FIG. 3 illustrates a partial side view of a flip chip ball grid array package according to an embodiment of the present invention; and FIG. 4 illustrates a flow chart for a method of reducing interfacial stress in an integrated circuit package according to an embodiment of the present invention.

Elements in the figures are illustrated for simplicity and clarity and have not necessarily been drawn to scale. For example, the dimensions of some of the elements in the figures may be exaggerated relative to other elements to help to improve understanding of the following description of the illustrated embodiments.

DESCRIPTION OF THE ILLUSTRATED EMBODIMENTS

As the semiconductor industry continues its aggressive miniaturization of circuit feature size, lower dielectric constant (low-K) materials have been developed to reduce capacitive effects in the metallization layers of integrated circuits. These low-K materials typically have small pores that reduce the effective dielectric constant. The porous and brittle nature of these low-K materials present new challenges in both the manufacturing and packaging operations. The robustness and reliability of the final package may be compromised by the differences in performance resulting from the use of low-K materials in semiconductor devices with respect to thermal coefficient of expansion, adhesion to adjacent layers, mechanical strength, thermal conductivity, and moisture absorption.

When layers of materials having differing coefficients of thermal expansion are bonded together, the layers expand and contract at different rates, resulting in strains in adjacent and neighboring layers. Semiconductor devices having low-K dielectric layers are inherently more prone to internal delamination or delamination from the underfill, molding compound, or other materials that are in close contact with the semiconductor device.

In addition to the strains induced by differing coefficients of thermal expansion, the adhesion to adjacent layers in semiconductor devices containing low-K dielectrics is inherently more prone to internal delamination or delamination from the underfill, molding compound, or other materials that are in close contact with the semiconductor device due the weak and brittle nature of low-K dielectrics.

The mechanical strength of low-K layers is lower than that of conventional layers due to the brittle nature of low-K dielectrics. Semiconductor devices containing low-K dielectrics are inherently prone to breaking or cracking during processes that involve physical contact with the semiconductor device surface, such as wire bonding and wafer probing, or processes that result in bending stresses such as molding and underfill curing, solder ball reflow, and temperature cycling.

New underfill materials have recently been developed to minimize the die stress and to prevent inner layer delamination in low-K silicon while concurrently reducing the strains on the flip-chip solder joints.

FIG. 1 illustrates the estimated interfacial die stress at the interface between the underfill and a low-K silicon dielectric and the solder bump strain for four underfill materials in a 45 mm ball grid array package.

Underfill materials "B", "C" and "D" all exhibit a significant reduction in die stress at the low-K silicon interface compared to underfill material "A", with underfill material "D" having the lowest die stress.

Underfill material "A" is representative of- a widely used underfill material of the prior art that uses a Bisphenol-F epoxy resin as the base material and a percentage of alumina fillers suspended in the base material. The percentage of alumina fillers is typically 45 to 55 percent by weight. The Young's modulus of underfill material "A" is about 5.5 to 6.0 GPa, and the coefficient of thermal expansion is about 45 to 50 ppm/° C. The glass transition temperature of underfill material "A" is about 150° C. The high value of the Young's modulus results in the relatively high value of interfacial die stress for underfill material "A" shown in FIG. 1.

Underfill materials "B" and "D" are representative of alternative underfill materials that have been considered for low-K applications. The values for the Young's modulus of underfill materials "B" and "D" is relatively high, ranging from about 8.0 GPa to about 10.0 GPa. The high interfacial die stress resulting from the high values of the Young's modulus may be reduced by using a low glass transition temperature between 70° C. to 80° C., however, the lower glass transition temperature disadvantageously subjects the solder bump joints to high strains during thermal cycling. The estimated solder bump strain for underfill materials "B", "C" and "D" is higher than that of underfill material "A", with underfill material "D" having the highest solder bump strain. Excessive solder bump strain may result in solder joint fatigue failure during board level thermal cycling in high performance applications.

Underfill material "C" is representative of an underfill material according to an embodiment of the present invention. Underfill material "C" may be made, for example, with a Bisphenol-F epoxy resin as the base material according to well known techniques used to make underfill material "A". The glass transition temperature of the underfill material "C" is also about 150° C. However, in contrast to underfill material "A", the percentage of alumina fillers suspended in the base material in underfill material "C" is substantially reduced compared to that of underfill materials "A", "B" and "D" from about 45 to 55 percent by weight to about 20 percent to 30 percent by weight. The Young's modulus of underfill material "C" is thereby advantageously reduced to about 3.0 GPa to about 4.0 GPa without reducing the glass transition temperature. The resulting die stress of underfill material "C" is only about two-thirds that of underfill material "A". The reduction in the percentage of fillers in underfill material "C" increases the coefficient of thermal expansion to about 55 to 60 ppm/° C., however the reduced value of the Young's modulus achieved in underfill material "C" mitigates the mismatch in the coefficient of thermal expansion. In addition to reducing the die stress, underfill material "C" also exhibits lower solder bump strain than underfill materials "B" and "D", typically about 1.55 percent as shown in FIG. 1.

Overall, the reduction of the filler percentage from more than 50 percent to about 20 percent to 30 percent in underfill material "C" advantageously results in an optimum balance between low-K interfacial stress and solder bump strain for improved flip-chip package reliability. An optimum balance between interfacial die stress and solder bump strain in the context used herein means a combination of interfacial die stress and solder bump strain that results in the maximum reliability of the solder bumps connecting the die to the laminated substrate for a selected underfill base material and a selected filler material. In addition to the Bisphenol-F base material and the alumina filler used to illustrate the example, other base materials and fillers may also be used with the identical filler percentage range of 20 percent to 30 percent to practice the present invention in various embodiments within the scope of the appended claims.

FIG. 2 illustrates a partial side view of a typical flip chip ball grid array package 200 of the prior art. Shown in FIG. 2 are a die 202, a laminated-substrate 204, solder bumps 206, an underfill 208, and solder balls 210.

The filler loading in the underfill 208 is illustrated by the white dots inside the shaded area between the solder bumps 206 and generally constitutes greater than 50 percent of the underfill 208 by weight. The underfill 208 is typically introduced in liquid form to fill the gap between the laminated substrate 204 and the solder bumps 206, for example, by capillary action, and is then cured into a solid according to well known techniques to protect the solder bumps 206 from fatigue due to thermal strain.

FIG. 3 illustrates a partial side view of a flip chip ball grid array package 300 according to an embodiment of the present invention. Shown in FIG. 3 are a die 202, a laminated substrate 204, solder bumps 206, solder balls 210, and an underfill 302.

The filler loading in the underfill 308 is illustrated by a lower density of white dots inside the shaded area between the solder bumps 206 and constitutes between 20 and 30 percent of the underfill 308 by weight. If the filler loading is too low, that is, less than about 20 percent by weight, then the resulting Young's modulus would be too low to adequately protect the solder bumps 206 from fatigue due to thermal strain. If the filler loading is too high, that is, greater than about 30 percent, then the resulting Young's modulus would be too high to provide adequate relief from interfacial stress.

In one aspect of the present invention, an underfill for an integrated circuit package includes a base material and a filler material added to the base material wherein the filler material constitutes a percentage by weight of the underfill to provide an optimum balance between interfacial die stress and solder bump strain in the integrated circuit package.

In another embodiment of the present invention, an underfill for an integrated circuit package includes a base material and a filler material constituting about 20 percent to 30 percent of the underfill by weight and a glass transition temperature of about 135° C. to 150° C. to achieve a Young's modulus of about 3.0 GPa to 4.0 GPa and a coefficient of thermal expansion of about 55 to 60 ppm/° C. when cured. The reduced filler loading compared to that of FIG. 2 is advantageously selected to provide an optimum balance between interfacial die stress and solder bump strain in the integrated circuit package compared to that of previous underfill materials.

In another embodiment of the present invention, a method of reducing interfacial stress in an flip-chip package includes steps of providing a base material and adding a filler material to the base material to form an underfill wherein the filler material constitutes 20 percent to 30 percent of the underfill by weight. The base material may be, for example, Bisphenol-F, and the filler material may be, for example, alumina. The underfill may be introduced between the solder bumps to fill the gap between the die and the laminated package substrate and cured to form a solid according to well known techniques.

FIG. 4 illustrates a flow chart for a method of reducing interfacial stress in an integrated circuit package according to an embodiment of the present invention.

Step 402 is the entry point of the flow chart 400.

In step 404, a base material is provided, for example, Bisphenol-F.

In step 406, a filler material is added to the base material to form an underfill so that the filler material constitutes 20 percent to 30 percent of the underfill by weight.

In step 408, the underfill is introduced between the solder bumps of a flip-chip package to fill the gap between the die and the laminated package substrate.

In step 410, the underfill is cured to form a solid according to well known techniques.

Step 412 is the exit point of the flow chart 400.

Although the method of the present invention illustrated by the flowchart description above is described and shown with reference to specific steps performed in a specific order, these steps may be combined, sub-divided, or reordered without departing from the scope of the claims. Unless specifically indicated herein, the order and grouping of steps is not a limitation of the present invention.

While the invention herein disclosed has been described by means of specific embodiments and applications thereof, numerous modifications and variations may be made thereto by those skilled in the art without departing from the scope of the invention set forth in the following claims.

What is claimed is:

1. An underfill for an integrated circuit package comprising:
   a base material; and
   a filler material suspended in the base material wherein the filler material constitutes a selected percentage by weight of the underfill to provide an optimum balance between interfacial die stress of a low-K dielectric layer of an integrated circuit die and solder bump strain for reliability of the integrated circuit package.

2. The underfill of claim 1 wherein the filler material constitutes a percentage by weight of the underfill within a range of about 20 percent to about 30 percent.

3. The underfill of claim 1 wherein the base material comprises Bisphenol-F.

4. The underfill of claim 1 wherein the filler material comprises alumina.

5. The underfill of claim 1 wherein the underfill has a glass transition temperature within a range of about 135° C. to about 150° C.

6. The underfill of claim 1 wherein the underfill has a Young's modulus within a range of about 3.0 GPa to about 4.0 GPa.

7. The underfill of claim 1 wherein the underfill has a coefficient of thermal expansion within a range of about 50 ppm/° C. to about 60 ppm/° C.

8. The underfill of claim 1 wherein the low-K dielectric layer comprises a porous material.

9. The underfill of claim 1 wherein the solder bump strain has a value of about 1.55 percent.

10. An underfill for an integrated circuit package comprising:
    a base material; and
    a filler material suspended in the base material,
    wherein the filler material constitutes a selected percentage by weight of the underfill to provide an optimum balance between interfacial die stress of a low-K dielectric layer of an integrated circuit die and solder bump strain for reliability of the integrated circuit package, and
    wherein the filler material constitutes about 20 percent to about 30 percent of the underfill by weight and wherein the underfill has a glass transition temperature of about 135° C. to 150 ° C., a Young's modulus of about 3.0 GPa to about 4.0 GPa, and a coefficient of thermal expansion of about 55 to 60 ppm/° C.

11. The underfill of claim 10 wherein the low-K dielectric layer comprises a porous material.

12. The underfill of claim 10 wherein the solder bump strain has a value of about 1.55 percent.

* * * * *